United States Patent [19]
Borodovsky et al.

[11] Patent Number: 5,498,579
[45] Date of Patent: Mar. 12, 1996

[54] METHOD OF PRODUCING SEMICONDUCTOR DEVICE LAYER LAYOUT

[75] Inventors: Yan A. Borodovsky, Portland; Ananda G. Sarangi, Beaverton, both of Oreg.

[73] Assignee: Intel Corporation, Santa Clara, Calif.

[21] Appl. No.: 255,655

[22] Filed: Jun. 8, 1994

Related U.S. Application Data

[62] Division of Ser. No. 165,395, Dec. 10, 1993, Pat. No. 5,424,154.
[51] Int. Cl.$^6$ ........................................ H01L 21/00
[52] U.S. Cl. ..................... 437/250; 437/50; 437/51; 156/659.11
[58] Field of Search ..................... 437/50–51, 250; 156/659.11; 364/491; 430/310–311

[56] References Cited

U.S. PATENT DOCUMENTS

| | | | |
|---|---|---|---|
| 4,895,780 | 1/1990 | Nissan-Cohen et al. | 430/5 |
| 5,308,741 | 5/1994 | Kemp | 430/312 |

FOREIGN PATENT DOCUMENTS 58226807  11/1985  Japan .

OTHER PUBLICATIONS

M. Helm, W. Kavanaugh, B. K. Liew, C. Petti, A. Stolmeijer, M. Ben-tzur, J. Bornstein, J. Lilygren, W. Ting, P. Trammel, J. Allan, G. Gray, M. Hartranft, S. Radigan, J. K. Shanmugan, R. Shrivastava, "A Low Cost Microprocessor Compatible, 18.4 µm$^2$, 6–T Bulk Cell Technology for High Speed SRAMS", Cypress Semiconductor Corp., pp. 65–66, 1993 Symposium On VLSI Technology Digest of Technical Papers, May 17–19, 1993, The Japan Society of Applied Physics and The IEEE Electron Devices Society.

*Primary Examiner*—George Fourson
*Assistant Examiner*—H. Jey Tsai
*Attorney, Agent, or Firm*—Blakely, Sokoloff, Taylor & Zafman

[57] ABSTRACT

A method of enhancing the lithographic resolution of randomly laid out isolated structures is disclosed. A first mask comprises an active layer with isolated features such as gates. Portions of the active layer have a reduced dimension typical of periodic structures. The first mask additionally has complementary features provided along side the reduced active features to provide periodicity. In this way, the resolution of the lithographic process is enhanced, and other enhanced resolution technologies additionally can be used to best advantage to form a patterned photosensitive layer having isolated features of reduced width. The photosensitive layer is then exposed to a second mask which exposes the complementary features so that they are removed from the latent image in the photosensitive layer. This second exposure also further improves resolution by enhancing the contrast between exposed and unexposed regions. A method is disclosed for automatically providing random logic device layouts having the complementary features, as well as for providing a layout for the second mask.

20 Claims, 15 Drawing Sheets

METHOD OF PRODUCING SEMICONDUCTOR DEVICE LAYER LAYOUT

This is a divisional of application Ser. No. 08/165,395, filed Dec. 10, 1993, U.S. Pat. No. 5,424,154.

BACKGROUND OF THE INVENTION

1. Field of the Invention

The present invention relates to semiconductor devices, and more specifically to a method and apparatus for lithographic resolution enhancement in logic device processing technologies.

2. Background Information

In the semiconductor industry, semiconductor devices are fabricated by forming several devices layers on a semiconductor substrate using lithographic methods to define the pattern of each layer. In conventional lithography, an exposure is performed using a single reticle exposed by a radiation source which irradiates the reticle at an angle perpendicular to the plane of the reticle. The resolution, which is typically defined as the smallest distance two features can be spaced apart while removing all photoresist between the features, is equal to:

$$\frac{k_1 \lambda}{NA}$$

where $\lambda$ is the wavelength of the exposing radiation, NA is the numerical aperture of the lens, and $k_1$ is a process dependent constant typically having a value of approximately 0.7. As can be seen from the above equation, the conventional resolution can be increased by using a smaller wavelength radiation source, and by using a lens with a larger NA. While both approaches have increased the resolution, there are several drawbacks. For example, since the depth of focus is proportional to $\lambda/NA^2$, decreasing the wavelength, and, to a greater extent increasing the numerical aperture, decreases the depth of focus. Additionally, other problems exist, such as the increased expense and complexity of systems with a large NA, and the long exposure times required for short wavelength (e.g., X-ray) photoresists. Therefore, several techniques have been developed to enhance the resolution of conventional lithography to allow for the formation of patterned resist layers with smaller dimensions than that achievable with conventional methods. One method, called oblique illumination illuminates a reticle from an oblique angle instead of the 90° angle used in conventional lithography. In this method the system is configured so that the aperture captures the zero and only one first order diffraction node of closely spaced features, in contrast to a conventional system which captures the zero order and both first order diffraction nodes. Thus, the oblique system is able to capture a zero and first order diffraction node separated by a larger angle than a conventional system. Since an inverse relationship exists between the pitch of a structure to be imaged and the angular distribution between the zero and the first order diffraction node of the scattered light, the oblique system is able to collect light from diffraction nodes separated by a larger angle to produce an image of smaller features, thus demonstrating higher resolution. Additionally, the depth of focus is enhanced because both the zero and the first order diffraction node collected by a projection system that utilizes oblique illumination has the same optical path at positions displaced from the focal plane. Another method of enhancing the resolution of conventional lithography is the use of phase-shifted masks (PSM). In a PSM mask, all features are surrounded by light transmitting regions which shift the phase of the transmitted light by 180° compared to the feature. In this way, the diffraction fringes at the edges of the features are effectively canceled, resulting in a better image contrast. Another method of enhancing lithographic resolution is called pupil filtering which involves modulating the phase properties of the exposing radiation through use of an optical element in the lens.

The resolution of both conventional and enhanced resolution lithographic processes is better for periodic features, such as those found in memory devices such as DRAM's, for example. The reason for this is that a greater percentage of the exposing radiation is contained in the diffraction nodes of periodic structures compared to that contained in the diffraction nodes of isolated features. It is these diffraction nodes which contain all spatial information of the features. The result is that periodic features of a given size have better contrast then isolated features, so that an exposure dose exists which will result in complete exposure of spaces without overexposure of lines. For example, FIG. 1 shows an aerial plot of intensity under a reticle 101 having isolated feature 102 and periodic features 103a–103c having a dimension near the resolution limit of the process. As can be seen, the difference in intensity between masked and unmasked regions (i.e., the contrast) is much greater for the periodic features 103a–103c (curve 113) than for an isolated feature 102 (curve 112). Therefore, for a given combination of exposing conditions, at some dimension isolated feature 102 cannot be resolved simultaneously with periodic features 103 that are within the resolution limit of the process. In addition to the increased resolution achievable on periodic structures, periodic structures typically have less variation in linewidth due to varying defocus. Thus, over the surface of a wafer, periodic structures exhibit a much tighter distribution of linewidths than do isolated structures. The difference between the projected image of periodic and isolated lines of the same size causes a difference in the size of these lines when their image is formed in the resist (called the proximity effect) thus causing a wider than desirable variation of the linewidth.

As mentioned above, the contrast and resolution of periodic features using either conventional or enhanced techniques remains better than that of isolated features. Unfortunately, most logic devices do not have periodic structures. Rather, such devices have numerous randomly spaced and isolated features, such as gates, which are, for optical purposes, laid out randomly across the device. Thus, the resolution for these devices is limited. FIG. 2 shows an example of multiple polysilicon lines 201, 202, 204, 205, and 206. Portions of polysilicon lines 201 and 202 form gates 201b and 202b over diffusion region 203. While, depending on the layout, portions of the polysilicon lines such as 201a, 204, 205, and others, may be periodic, other portions such as the portions forming gates 201b and 202b are not surrounded sufficiently close by other polysilicon lines to provide the necessary periodicity for maximum resolution. Therefore, a layer such as the first polysilicon (poly 1) layer from which the lines 201 and 202, including gates 201b and 202b, are formed, is drawn with the minimum dimension that will provide manufacturing worthy image contrast on isolated features. Thus, the transistors have a drawn channel length at the minimum dimension that can be achieved on isolated structures which, as described above, is greater than the minimum dimension which can be achieved on a layer having only periodic structures. As is well known, a small channel length is desirable to achieve higher device performance.

What is needed is a method and apparatus for achieving improved lithographic resolution on isolated structures. The method and apparatus should allow for fabrication of, for example, isolated transistors with reduced dimension gates and improved performance. The method and apparatus should also reduce or eliminate the proximity effect in the fabrication of layers with both periodic and randomly spaced lines. What is further needed is a method of providing a device layer layout having features or portions of features of the desired size.

SUMMARY OF THE INVENTION

A method and apparatus is disclosed whereby complementary features are added to isolated device features on a first mask to produce a periodic structure to allow for maximum resolution of the lithographic process. The complementary features are obliterated by exposure to a second mask prior to forming the patterned resist layer. The second mask also provides improved contrast. In this way, isolated features having a dimension equal to or better than that achievable with periodic structures, are produced. In the present invention, the proximity effect is eliminated. A method of automatically providing a layout for the first and second masks is also disclosed.

Additional features and benefits of the present invention will become apparent from the detailed description, figures, and claims set forth below.

BRIEF DESCRIPTION OF THE DRAWINGS

The present invention is illustrated by way of example and not limitation in the accompanying figures and in which.

DETAILED DESCRIPTION

A lithographic enhancement method and apparatus for isolated structures is disclosed. In the following description, numerous specific details are set forth such as specific materials, reticle patterns, dimensions, etc. in order to provide a thorough understanding of the present invention. It will be obvious, however, to one skilled in the art that the specific details need not be employed to practice the present invention. In other instances, well known materials or methods have not been described in detail in order to avoid unnecessarily obscuring the present invention.

Figure 3:
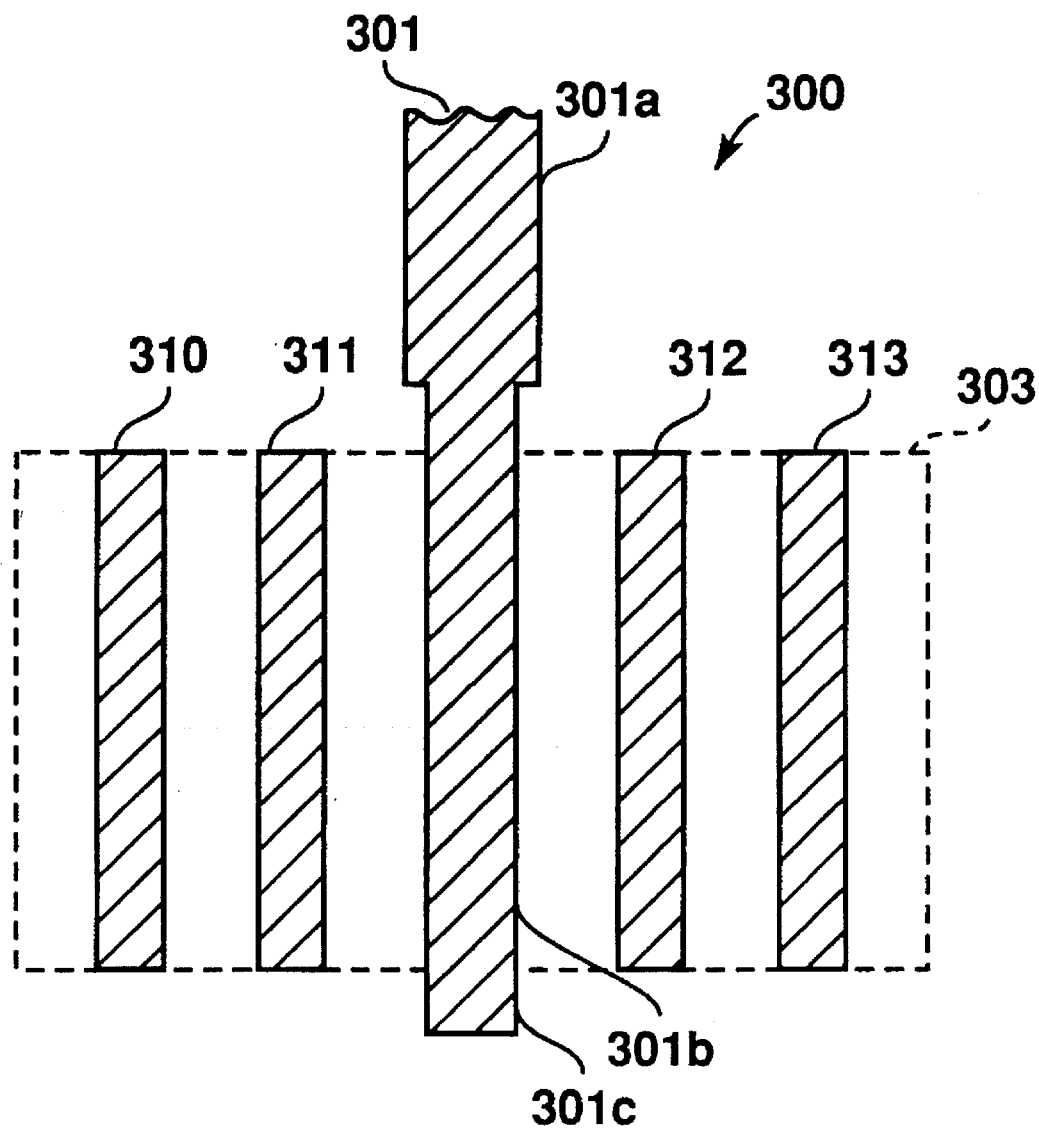
FIG. 3 shows a portion of a reticle according to the present invention.

FIG. 3 shows an example of a portion of a reticle used to fabricate a single gate to be formed over a diffusion area on the finished device. The reticles shown herein are used to form an image in a positive photoresist layer. Therefore, the reticle comprises light blocking regions corresponding to the features, and open, light transmitting field areas surrounding the features. Typically, the features comprise an opaque layer of, for example, chrome, formed on a reticle base made of quartz, in many of the illustrations, it is useful to show reticle features for one layer in relation to features of other layers. It will be understood that these features of other layers are not present on the reticle under consideration but are shown merely for ease of illustration. Further, in many instances, examples of dimensions on a reticle may be given. It will be appreciated that these dimensions are given on a 1:1 basis with the final patterned photoresist image, and that the actual dimensions on the reticle may be greater depending upon the image reduction factor (IRF) of the printer upon which the reticle is used. Referring to FIG. 3, polysilicon line 301 has portion 301a corresponding to the polysilicon line in regions other than the gate regions and portion 301b which forms the gate of a transistor to be formed over a diffusion region, also referred to as an active region, whose boundaries are shown by dashed line 303. As shown, portion 301b which overlies the diffusion region 303 is narrowed compared with other portions such as 301a. Additionally as shown, endcap 301c extends a distance beyond diffusion region 303. The presence of an endcap ensures that any rounding which occurs at the end of a polysilicon line occurs over the field, and not the active region 303, as rounding over the active region 303 may lead to punch-through. Typically, portion 301a of polysilicon line 301 has a dimension equal to the minimum dimension which can be satisfactorily resolved when fabricating device layers having isolated features. Portion 301b has a dimension equal to or below the minimum dimension which can be formed by the lithographic process when fabricating periodic features. These dimensions will depend upon the specific lithographic process, including, for example, the exposure wavelength, resist materials, illumination technique, mask types, etc. The improvement in resolution achievable with the present invention, and the ways in which the present invention improves the resolution and/or process latitude, will be discussed in more detail later. As shown, reticle 300 also comprises complementary features 310–313. Complimentary features 310–313 are spaced and sized to provide the optimum periodicity for patterning gate 301b. Although four such complementary features 310–313 are shown, it will be appreciated that a greater or lesser number can be used. Typically, at least one complementary feature on each side of the active feature is desirable. In a preferred embodiment, the period of lines and spaces near active features is kept approximately uniform, as shown. Upon exposure by reticle 300, the photosensitive layer will have a latent image corresponding to the pattern of reticle 300, e.g., having features 301 and 310–313.

Figure 4:
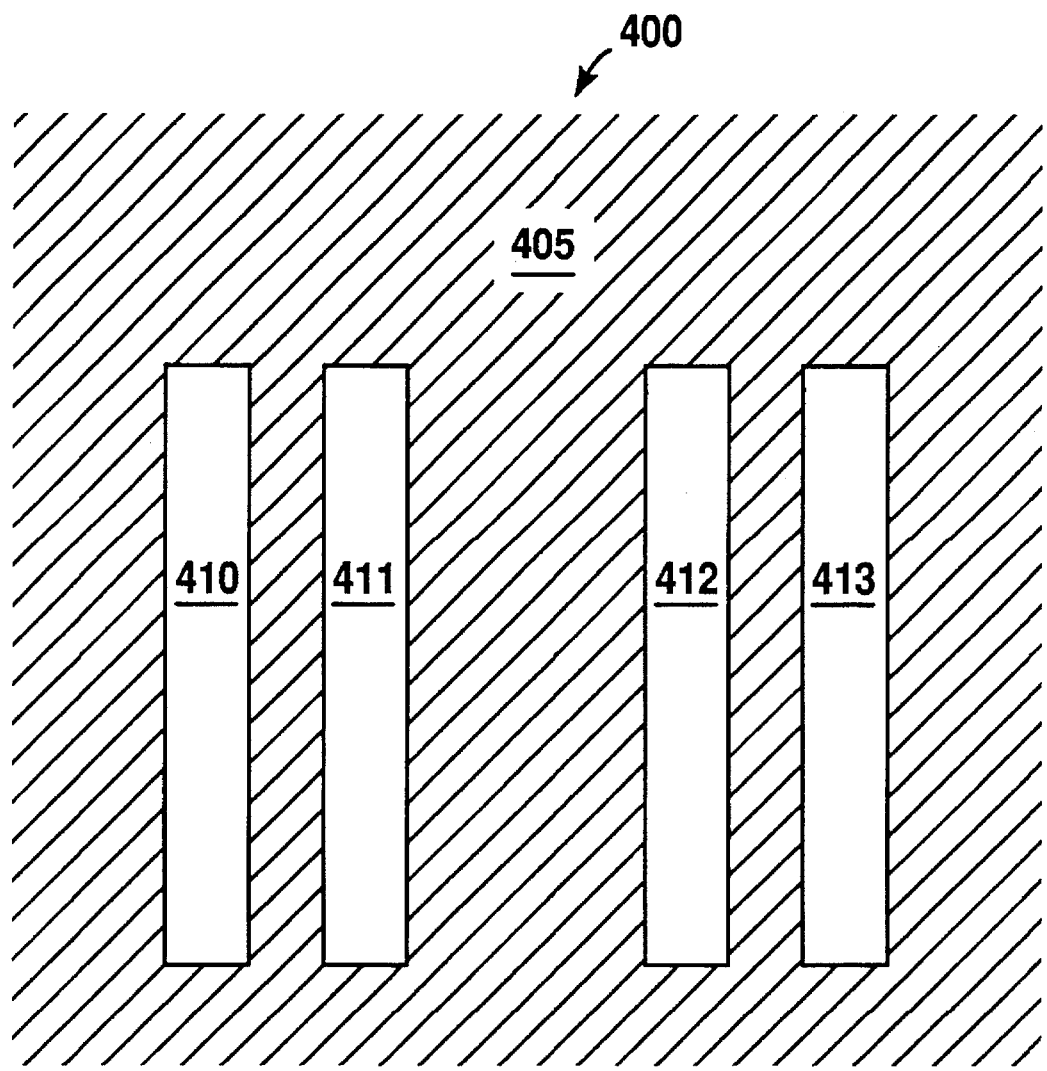
FIG. 4 shows a complementary reticle for the reticle of FIG. 3 according to the present invention.
Figure 5:
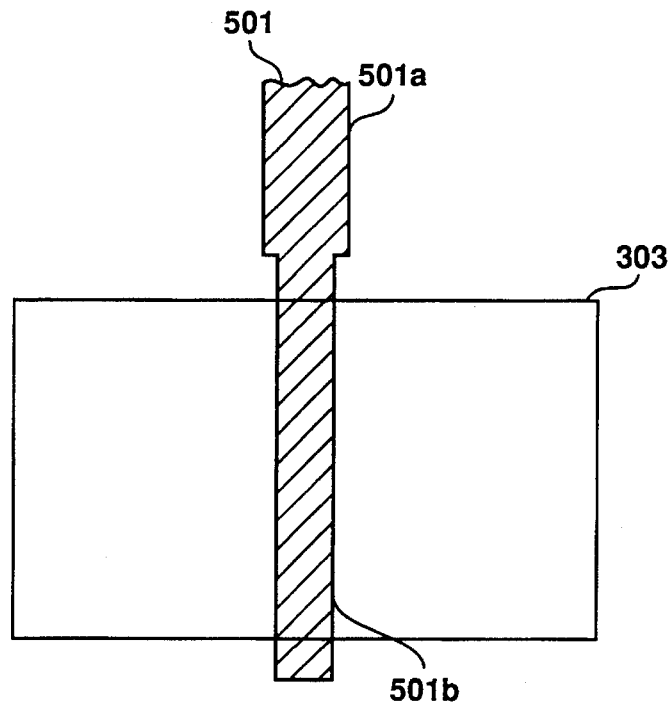
FIG. 5 shows a patterned resist layer formed using the reticles of FIG. 3 and 4.

While the complementary features 310–313 on reticle 300 are desirable because they provide periodicity, the presence of polysilicon features on a finished device corresponding to the complementary features is undesirable or prohibitive. Therefore, these features cannot remain on a finished device. In a currently preferred embodiment, these features are obliterated from the latent image in the resist prior to development. Referring now to FIG. 4, after the substrate having the photosensitive layer is exposed to reticle 300, it is then aligned and exposed to reticle 400 of FIG. 4. Reticle 400, called a complementary reticle herein, has open regions 410–413 formed within opaque layer 405. Each of regions 410–413 corresponds to the complementary features 310–313, respectively, of reticle 300 of FIG. 3. In a preferred embodiment, each of the openings 410–413 has a size equal to the size of the corresponding complementary feature 310–313 plus an additional amount. In a preferred embodiment, the additional amount is 3 sigma (standard deviation) of alignment accuracy between the device layer reticle and the complementary reticle. The addition of 3 sigma per side extra width on the openings 410–413 will ensure that the latent images formed by complementary features 310–313 of reticle 300 are completely exposed with reticle 400. Thus, in the portion of the device layer shown, only the portion of the photosensitive layer corresponding to polysilicon line 301 has been blocked from exposure by both reticles. All other regions have been exposed through either reticle 300 or reticle 400 and will be removed upon developing. After the photoresist layer is developed, the polysilicon layer is etched to form patterned polysilicon lines and gates using well known methods. FIG. 5 shows a portion of a device during fabrication fabricated according to the above described methods. As shown, polysilicon line 501, including gate portion 501b having a narrowed dimension is formed over diffusion region 303.

The present invention may be used in conjunction with phase-shifting masks. As one example, referring again to FIG. 3, the regions in between the complementary features, and in between a complementary feature and the gate 301b may alternate in phase. For example, the region between complementary features 310 and 311 may transmit light of a first phase, which may be called the zero degree phase for reference, while the region between complementary feature 311 and gate 301b transmits radiation shifted in phase in integer multiple of 180°, called the 180° phase. Similarly, the region between gate 301b and complementary feature 312 transmits radiation of the zero phase, while the region between complementary features 312 and 313 transmits radiation of the 180° phase. Typically, these phase differences are created by etching a thickness of the reticle substrate in the alternate regions in an amount sufficient to shift the phase of radiation 180°, or an integer multiple thereof.

Figure 6:
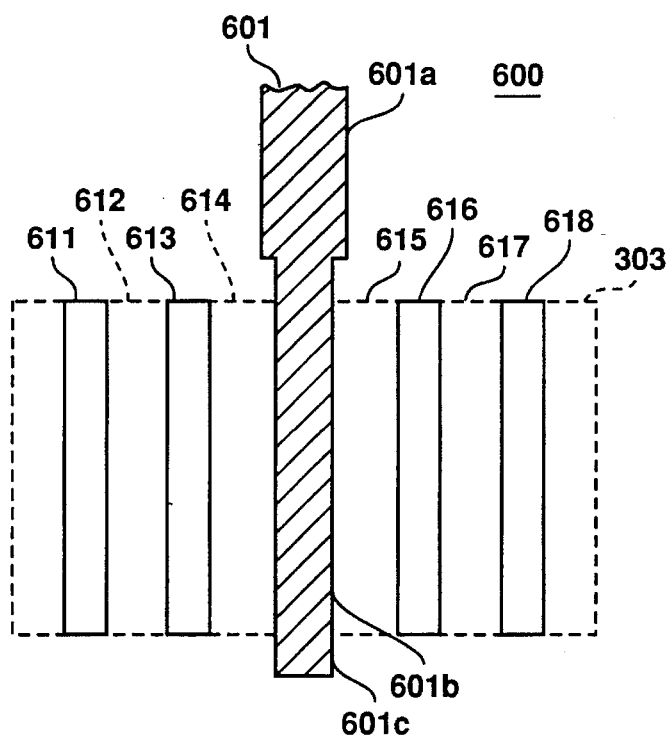
FIG. 6 shows an alternative embodiment of the reticle of FIG. 3.

Referring now to FIG. 6, a further embodiment of the present invention is shown. Reticle 600 comprises a chrome member 601 corresponding to the polysilicon line and gate. Complimentary features 611–618 are present on both sides of the gate portion of 601b. In reticle 600, all of the complementary features 611–618 are light transmitting. However, each complementary feature is 180° out of phase with respect to the complementary features on either side of it. Thus for example, complementary features 611, 613, 615, and 617 are the zero degree phase while complementary features 612, 614, 616, and 618 are the 180° phase. Again, as with the embodiment of FIG. 3, the periodicity of the complementary features allows for enhanced resolution as described before. The complementary mask for reticle 600 is typically different from reticle 400 since all of the complementary features are light transmitting. Due to the cancellation of radiation near the edges of two adjacent features, regions corresponding to the borders of the complementary features are unexposed or only partially exposed. Therefore, one complementary mask for reticle 600 comprises openings corresponding to the interfaces of the adjacent complementary features. The openings are upsized using the considerations described in conjunction with reticle 400. That is, depending upon the lithographic process, a latent image of a given size is formed at the boundaries of two complementary features, so that the complementary mask has openings corresponding to this size plus 3 sigma of overlay. Alternatively, the complementary mask for reticle 600 may comprise chrome regions corresponding to and larger in dimension on each side (by 3 sigma of alignment overlay, for example) than the active polysilicon features 601 of reticle 600. This latter embodiment may also be used as a complementary mask for reticle 300 as well.

Figure 2:
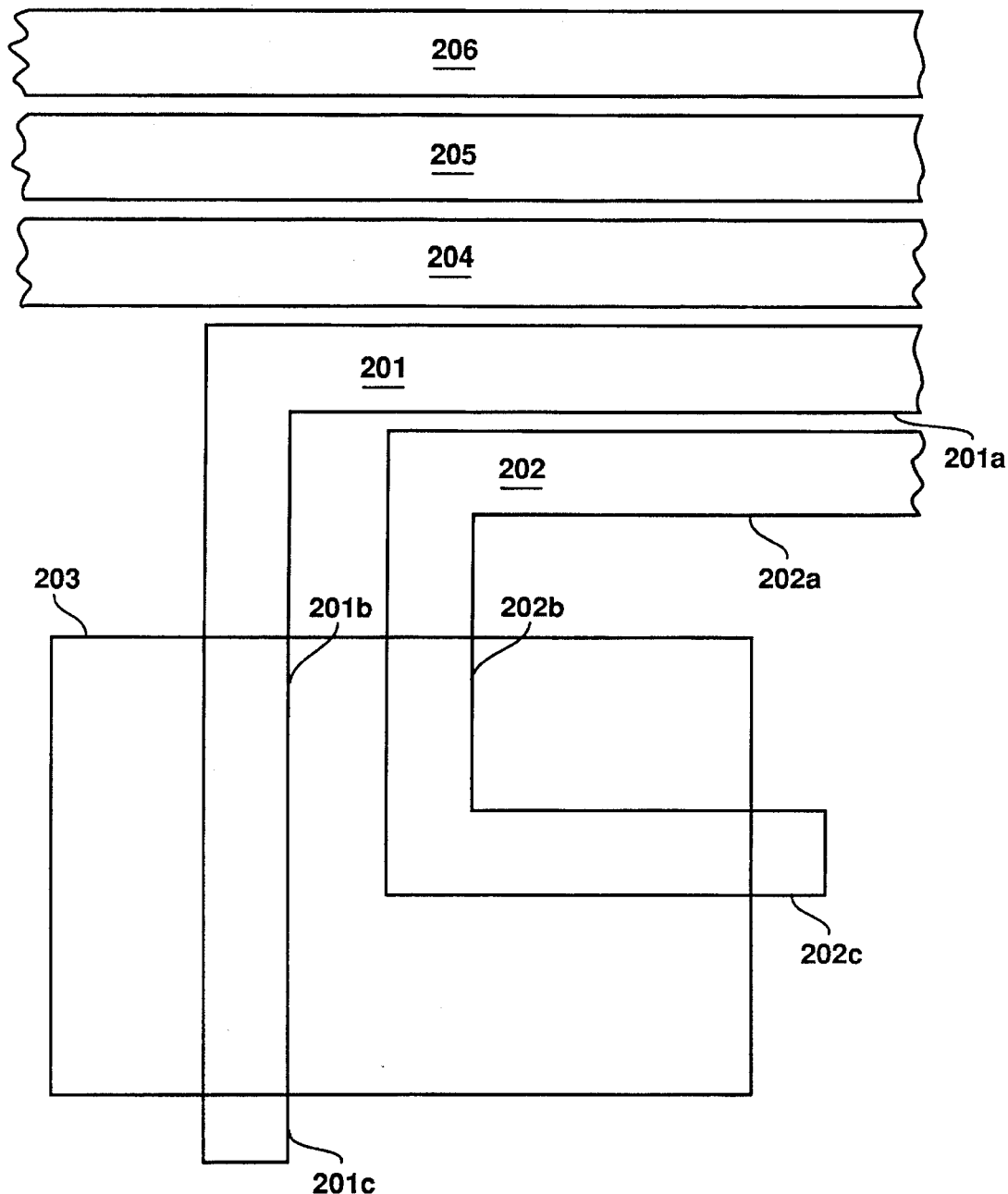
FIG. 2 shows an example of a gate in a prior art logic device.
Figure 7:
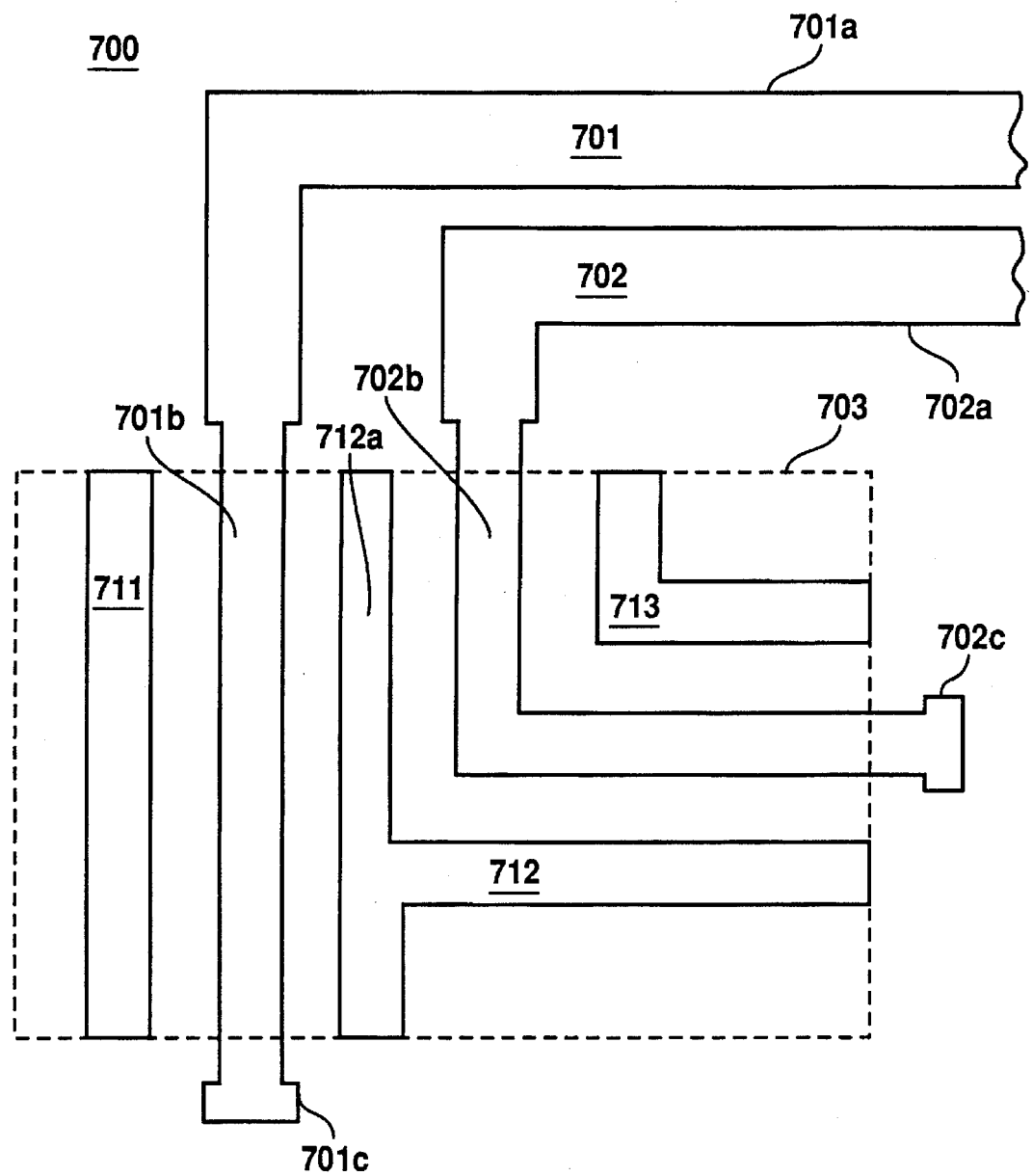
FIG. 7 shows a reticle according to the present invention used in the fabrication of a gate similar to that shown in FIG. 2.

FIG. 7 illustrates use of the present invention to form gates similar to those shown in FIG. 2 having a reduced dimension. Reticle 700 has polysilicon lines 701 and 702 having gates 701b and 702b, respectively, which overlie diffusion region 703. As shown, reticle 700 comprises complementary features 711, 712, and 713 in the active region 703. As shown, gates 701b and 702b have endcaps 701c and 702c, which prevent punch-through at the edge of the diffusion region 703. Note that complementary feature 712 has portion 712a which is slightly narrowed. This is due to the fact that there is insufficient room between gates 701b and 702b for the portion 712a to have a width equivalent to that of, for example, complementary features 711, 713, and other portions of 712. However, note that with respect to the openings on both sides of both gates 701b and 702b, the period remains constant. That is, for example, the distance from the left edge of gate 701b to the left edge of complementary feature 712 is equal to the distance from the right edge of gate 701b to the right edge of complementary feature 711, and, additionally this is also equal to the distance between the left edge of gate 702b and the left edge of complementary feature 713, which in turn is equal to the distance between the right edge of gate 702b to the right edge of complementary feature 712. An approximately equal period for at least one space on each side of a reduced dimension feature is preferably maintained for all such features on the device. Additionally, if more than one complementary feature per side of active feature is desired, it is further desirable to maintain this periodicity to the extent possible. However, variation in period beyond the first complementary feature on each side is not a significant problem. For example, the narrowing of portion 712a, which to a minor extent disrupts the periodicity between the alternating complementary features 711–713 and gates 701b and 702b across active region 703, has no appreciable effect on the patterning of the narrowed gates 701b and 702b. In a currently preferred embodiment, the reduced portion of the device layer, the complementary features, and the spacing therebetween are kept, to the extent possible, approximately equal in width.

As described herein, only selected portions of an active layer, such as the portions of the polysilicon layer forming the gates of the device, are narrowed. Note that in some areas, for example, between portion 701a and 702a, there is insufficient room in which to place the complementary features described herein. Thus, to apply the use of complementary features to create periodicity for an entire device layer, would typically require some increase in die size, as all lines would have to be spaced a sufficient distance to allow for complementary features. While in some circumstances, it may be possible to downsize all or portions of the active layer and place the features close enough to each other to provide periodicity, this is typically not possible over the entire die, so that at least in some portions of the die spacing between adjacent portions of the active layer would have to be increased in order to allow for placement of the complementary features. However, in the present invention, this increase in die size is avoided by downsizing the active layer and placing the complementary features only in regions where the polysilicon lines overlie active regions, where there is always sufficient space, so that the reduced gate dimension, and consequent performance enhancement, is achieved, without any increase in die size.

Figure 1:
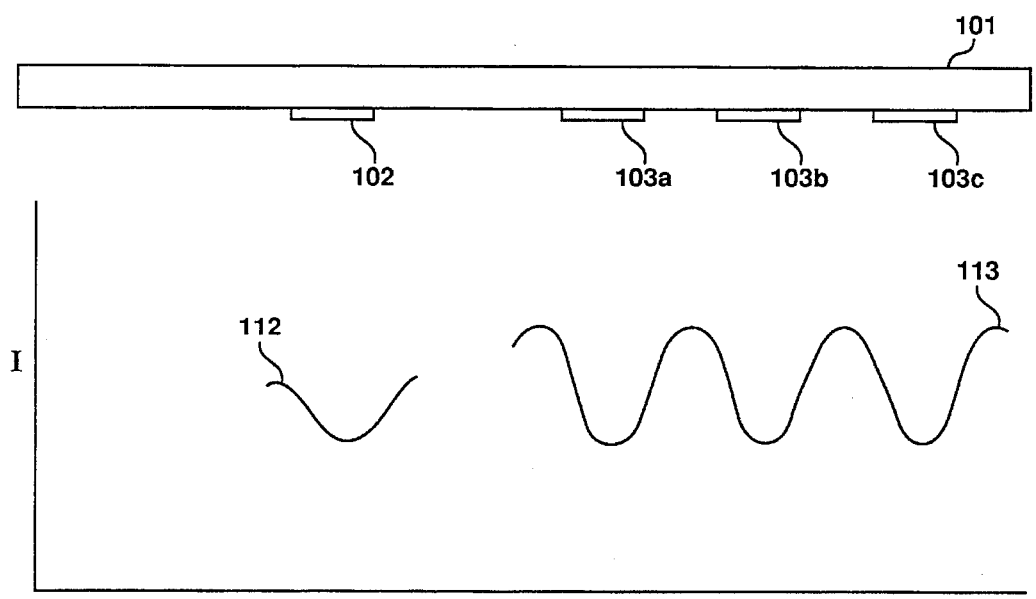
FIG. 1 shows an aerial intensity plot of isolated and periodic structures on a reticle.
Figure 8:
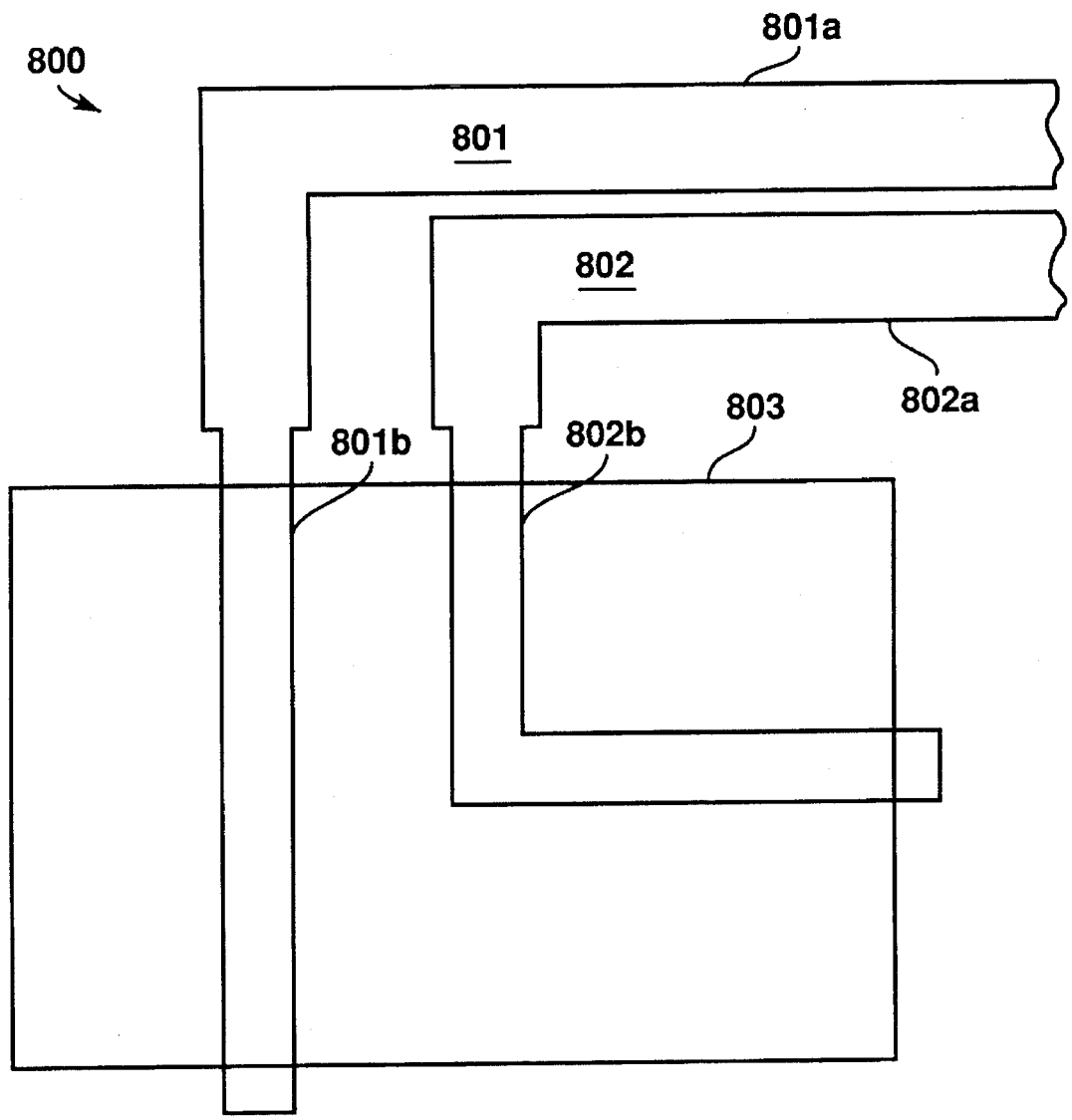
FIG. 8 shows a patterned resist layer formed using the reticle of FIG. 7 and a complementary reticle according to the present invention.
Figure 26:
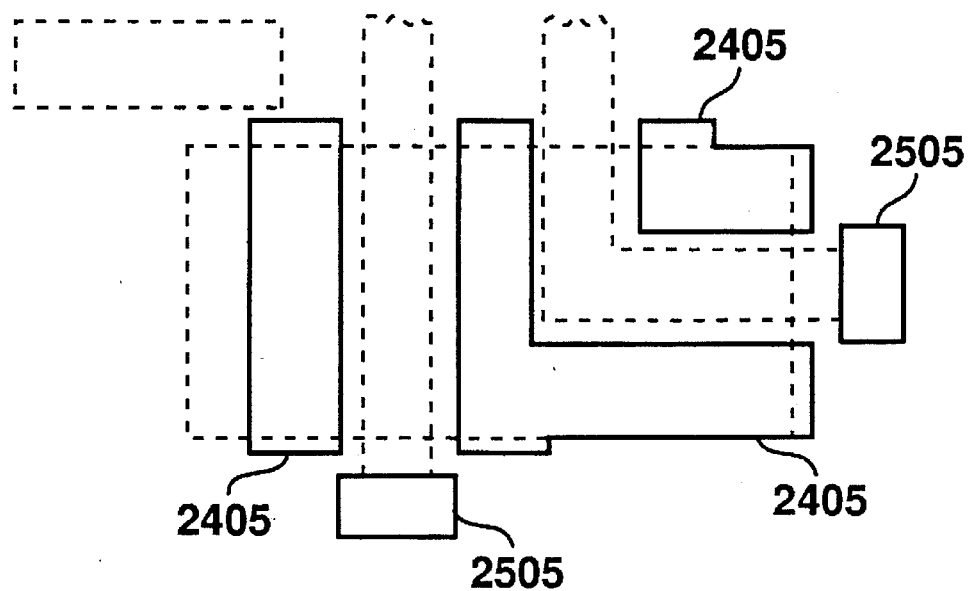

FIG. 8 shows a portion of patterned photoresist layer 800 after exposure to reticle 700 of FIG. 7 and the corresponding complementary reticle, followed by development, (The layout for the complementary reticle for reticle 700 is shown in FIG. 26.) As shown, the polysilicon lines 801 and 802 have narrowed portions 801b and 802b over active region 803, which from reduced width gates, thereby forming transistors having channels with a reduced effective channel length. As described earlier in conjunction with FIG. 1, the presence of periodicity increases the resolution of any lithographic process compared with the resolution of the process on isolated features. Therefore, the resolution of the portion of the layer where complementary features are placed can be at least equal to that achievable on periodic features. However, further improvement in resolution is provided by use of the complementary reticle of the present invention. As described earlier in conjunction with FIG. 1, if there is insufficient contrast between lines and spaces, no exposure dose exists which will result in complete exposure of the spaces without overexposure of the lines. While periodic features have better contrast then isolated features, at some point periodic features have insufficient contrast as feature size is reduced.

Figure 9:
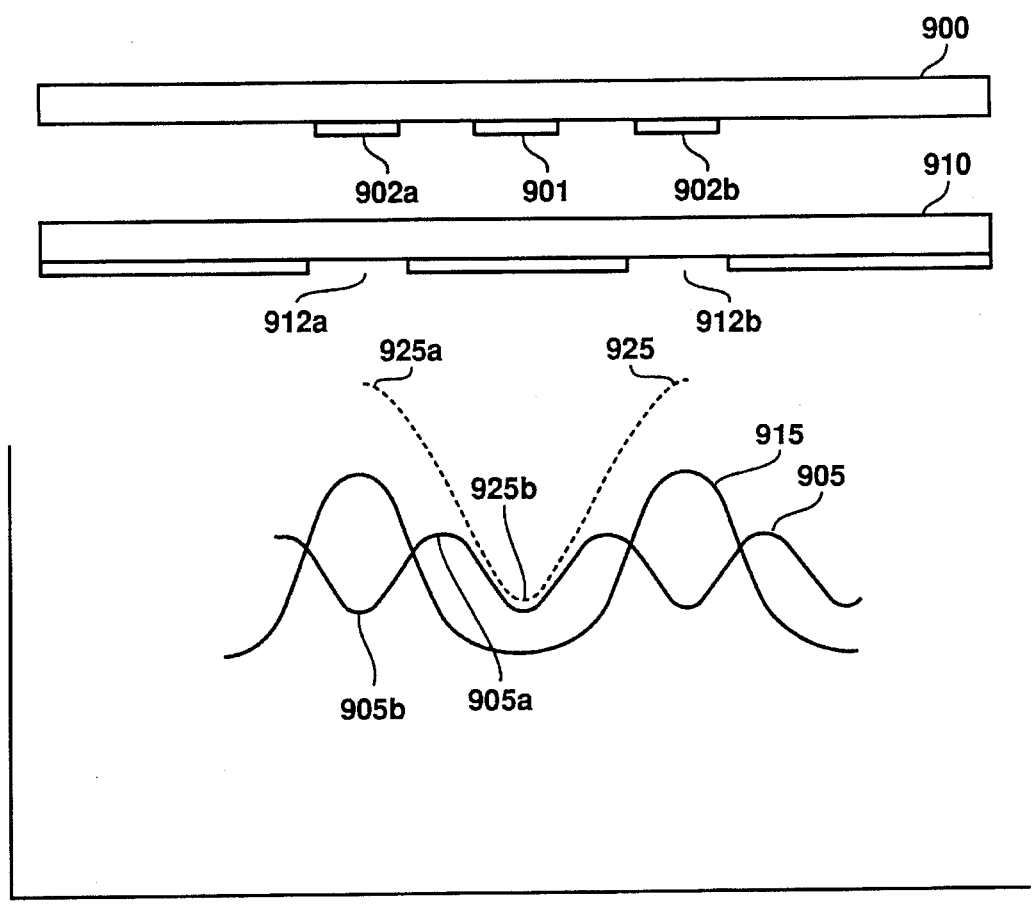
FIG. 9 shows an aerial intensity plot of a reticle and complementary reticle according to the present invention.

Referring now to FIG. 9, a composite illustration of an aerial intensity plot 905 for a reticle 900 having an active feature 901 and complementary features 902a and 902b, and an aerial intensity plot 915 for a complementary reticle 910 having openings 912a and 912b, is shown. Also shown is composite intensity plot 925, which represents the total intensity to which the photoresistive layer is exposed after exposure to both reticle 900 and complementary reticle 910 (i.e., the summation of plots 915 and 905). The image contrast, C, is given by the formula:

$$C = \frac{(Imax - Imin)}{(Imax + Imin)}$$

where Imax and Imin are the maxima and the minima, respectively, of the light intensity of the aerial image produced by the feature. Typically, a contrast value of 0.6 is needed for a manufacturable process. For example, for reticle 900, the contrast value is determined by subtracting the intensity value at point 905a from the intensity value at point 905b, and dividing the result by the sum of these intensity values to get the image contrast. Assume, for purposes of illustration, that the active feature 901 and complementary features 902 are of a size such that the image contrast is less than 0.6, for example, so that there is insufficient contrast to resolve these features by exposing reticle 900 alone. Note, however that the composite intensity plot 925 shows a much greater difference in intensity between the maximum (point 925a) and minimum (point 925b) intensity values, primarily due to the increase in the maxima from exposure to reticle 910, so that the image contrast is much greater than that of reticle 900 alone. Thus, the present invention provides for improved resolution by providing periodicity and by providing for additional exposure intensity in selective regions, thereby improving contrast. In general, the importance of the complementary reticle in improving contrast increases as the feature size decreases. So that at feature sizes near or slightly below the resolution of the lithographic process on isolated features, the provision of periodicity allows for improved resolution, and the reticle having the active and complementary features may be exposed with a dose sufficient to resolve the features, in which case the complementary reticle serves mainly to obliterate the complementary features. At smaller dimensions, the exposure doses for both reticles must be adjusted to provide for complete exposure of the spaces, without overexposure of the lines, to provide a composite intensity with sufficient contrast. The exposure dose for each mask will depend on the specific lithographic process and features being formed, and some experimentation with exposure parameters for both reticles, within the skill of one skilled in the art, may be necessary to achieve acceptable resolution.

In addition to the resolution enhancement provided by the present invention, the present invention can be used in conjunction with other resolution enhancement techniques, such as those described in the background section, to allow for further improvements in resolution. Additionally, for a given process and feature size, the use of the present invention results in improved process latitude compared to the same process and feature size formed without the practice of the present invention.

The resolution achievable with the present invention will vary depending upon the specific lithographic process used, including whether an enhancement technique such as oblique illumination, or phase-shifting is used. Exemplary feature sizes for a given process, and a give set of design rules, are described below in conjunction with a description of a method for providing the layouts for the reticles of the present invention. It will be understood that the feature sizes and design rules are merely examples, and use of the present invention for processes having different design rules and different features sizes is within the spirit and scope of the present invention using the principles described herein. The improvement in resolution described herein is merely exemplary and is not meant to limit the present invention. Further, there is always some trade-off between resolution and process latitude, so the maximum resolution achievable with the present invention will depend upon the amount of process latitude that is considered acceptable.

As described previously, random logic circuit layouts typically have many different gate types and structures, which are laid out randomly. While it is possible for a circuit designer to hand draw the structures described herein, this is extremely time consuming as this must be done for each transistor, of which there are millions. Therefore, a method is provided wherein complementary features are provided near desired portions of a device layer, without any effect on the die size, and without violating any design rules. The steps used to produce a device layout according to the present invention are described below in relation to FIGS. 10–26. In the procedure described herein a method of implementing the present invention on a previously designed layer, the first polysilicon (poly 1) layer from which the gates of the device are fabricated, is described to illustrate how the present invention may be practiced on a device layer which has been designed in accordance with resolution attainable with isolated features. It will be understood that the previously designed layer is not restricted to device layers which are known in the prior art. Rather, for purposes of illustration, the discussion herein assumes that a layer is first designed, or already exists, without the teachings of the present invention, and is then modified according to the present invention. It will be understood that the teachings herein can be utilized to create a new device layer according to the present invention. Furthermore, it will be understood that not all of the steps described herein are necessary, and that some of the steps may be performed in a different order from the sequence described below. Also, while specific dimensions are given for feature sizes, design rules, and amounts of upsize or downsize, it will be appreciated that other dimensions and amounts be used in accordance with the teachings of the present invention.

In the following description, the formation of a poly 1 device layer is described in conjunction with a database containing data which defines each layer of a device. To illustrate steps of the method, portions of the poly 1 layer relevant to the step under discussion are shown in solid outline form. It will be appreciated that many of the structures shown herein are the results of intermediate steps in the creation of the layouts for the reticle and complementary reticle of the present invention, and these structures themselves do not form a part of the final device layer. To better illustrate each step, portions of the poly 1 layer not relevant to the step under consideration, and portions of an underlying diffusion region, are shown in dashed outline form. It will be appreciated that in the Figures, the exact placement of the various features and intermediate features, and the dimensions of the various features, intermediate features, and amounts of size up or size down, for example, are not necessarily to scale.

Figure 10:
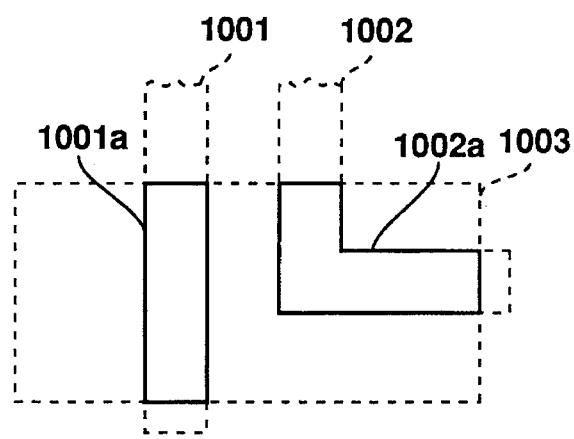
FIGS. 10–26 illustrate steps in the design of reticles according to the present invention.
Figure 11:
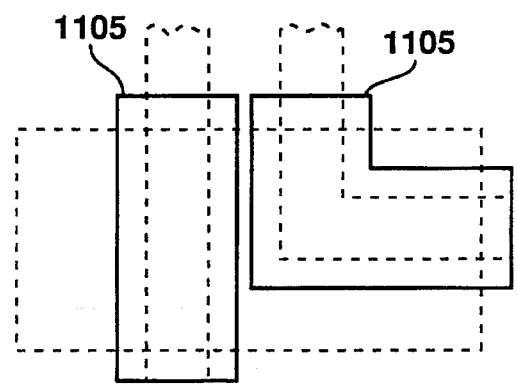

First, the relevant layers from the database are determined. For the purposes of forming periodicity near transistor gates, the poly 1 layer from which the gates are formed must be extracted from the database. Further, since it is desired to form the periodicity in the active regions, the diffusion layer is also necessary. Next, the areas of interest are found. Referring to FIG. 10, a portion of a diffusion layer having diffusion area 1003 and a portion of a polysilicon layer having polysilicon lines 1001 and 1002, are shown. As shown therein, the areas of interest, i.e., the gates, 1001a and 1002a have been identified by performing a logical AND operation between the poly 1 and diffusion layers. The logical AND operation defines regions where both the poly 1 and the diffusion layer are present. Next, the identified areas are sized up by some amount. As will be seen, this size up is done to provide regions approximately bordering the gates, as will be discussed in conjunction with FIGS. 11 and 12. In the currently preferred embodiment, the gates are sized up on all sides by an amount equal to the design rule of the endcap, approximately 0.24 µm in a currently preferred embodiment, although other size up amounts may be used. The sized up regions are shown as regions 1105 of FIG. 11. Next the poly 1 layer is subtracted from the regions 1105 to form regions 1205 of FIG. 12, which border the poly 1 layer around the portions forming the gates.

Figure 12:
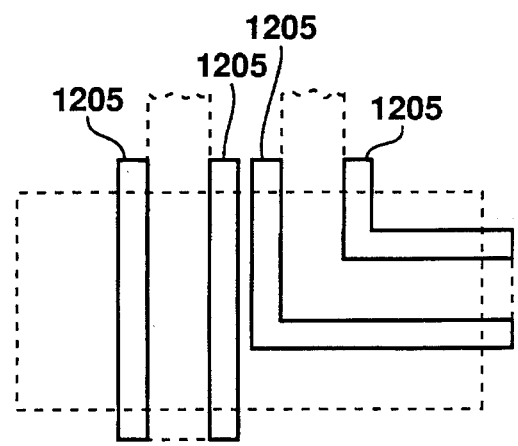
Figure 13:
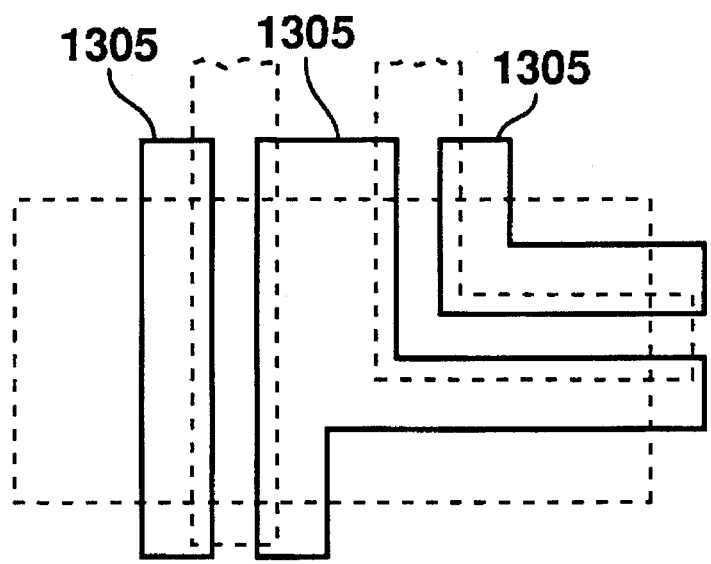
Figure 14:
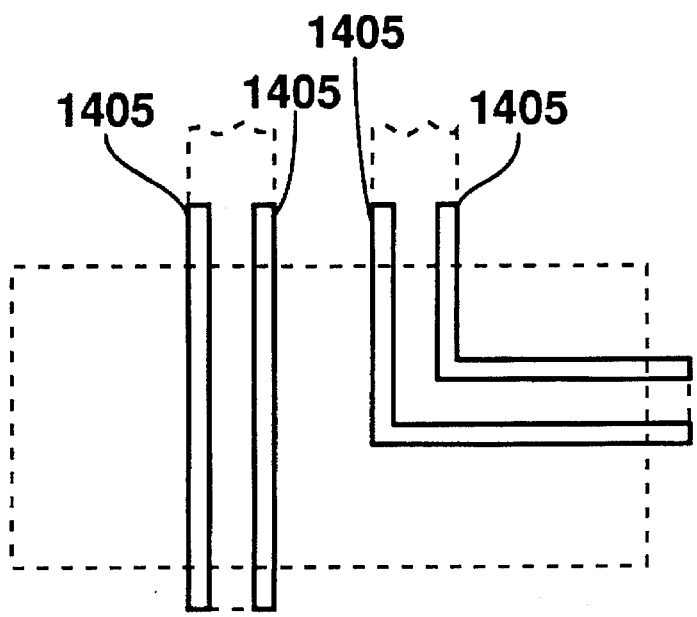
Figure 15:
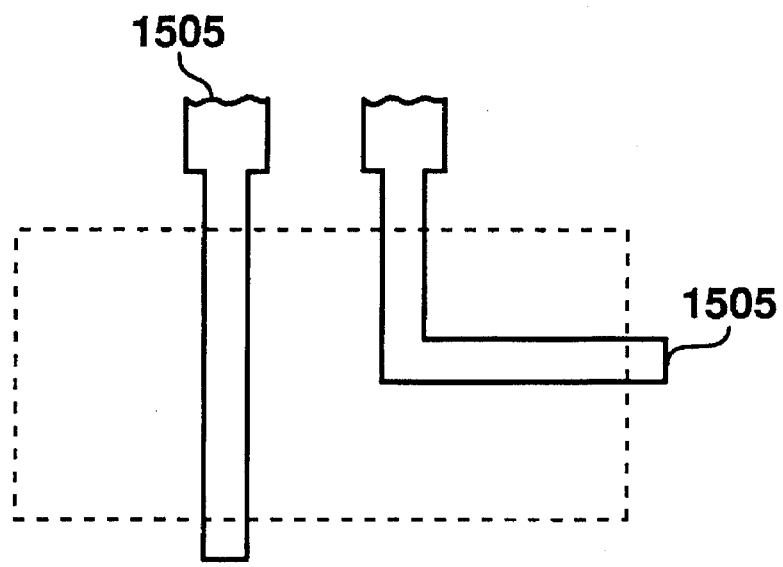

Following the above steps, the regions 1205 of FIG. 12 are sized up by the amount it is desired to downsize the gates. The amount by which the gates are downsized is a design choice taking into account the lithographic process used and the required process latitude. As an example, in an embodiment where the polysilicon lines have a width of 0.4 µm and a spacing 0.6 µm prior to the practice of the invention, the polysilicon gates are downsized by 0.06 µm per side by upsizing regions 1205 by 0.06 µm on all sides. These upsized regions are shown as regions 1305 of FIG. 13. Next, a logical AND operation is performed between the regions 1305 of FIG. 13 and the poly 1 layer. The preceding AND operation results in the regions 1405 of FIG. 14. Thus, the preceding steps have created strips along portions of the gate, (and additionally a small distance over the field) representing the portion of the poly 1 layer to be removed to downsize the gate. Next, the regions 1405 are subtracted from the poly 1 layer to form the regions 1505 of FIG. 15.

Then, the regions 1505 are sized up and then sized down by 0.20 µm, which is slightly less than one half of the design rule minimum feature amount of 0.48 µm. This step is done to ensure that any portion of the poly 1 lines near the active regions which were clipped in the preceding steps is returned to a legal shape. For example, if any of the preceding steps resulted in a "mousebite" being taken out of a poly line, the up sizing would result in a substantially rectangular shape since the mousebite fills in from all sides. Upon downsizing by the same amount, the poly line returns to its original size and shape without the mousebite. The size up amount is sufficient to fill any such voids or gaps but not so large as to cause merger of features. Following this, the regions 1505 are sized down and then sized up by approximately 0.10 µm which is slightly less than one quarter the minimum feature size. This size up and size down removes any invalid shapes such as dog bone type shapes which may result, for example, if an endcap is slightly larger than the design rule amount, so that the very end of the endcap has not been reduced in width in the proceeding steps. It will be appreciated that the invalid shapes removed in the proceeding two steps are not shown in the Figures since no such invalid shapes were generated in the portion of the poly 1 layer shown. However, these steps may or may not be necessary as a precaution to remove the above-described shapes depending upon the specific layout. Typically, many of these shapes would not lead to device failure but are invalid because they make mask fabrication and/or inspection difficult.

In a current embodiment, one design rule is that poly 1 lines must be spaced at least 0.16 µm from any diffusion regions. However, the size up of 0.24 µm described above in relation to FIG. 11 and the size up of 0.06 µm described above in relation to FIG. 13 together defined regions extending 0.30 µm beyond the diffusion area. Because of the 0.16 µm design rule, a poly 1 line may make a turn within this distance, resulting in a notch being removed by the preceding steps near the turn. To prevent this, in a currently preferred embodiment any reduced portion of the poly 1 line beyond 0.16 µm from the diffusion regions is captured back as follows. First, regions 1305 of FIG. 13 have subtracted from them regions 1105 of FIG. 11. Next, a logical AND operation is performed between the resulting regions of the previous step and the poly 1 layer. In the portion of the layer shown, the preceding subtraction and AND operations define portions of the poly 1 layer extending from 0.24 µm to 0.30 µm beyond the active area, along the edges of the poly 1 lines at the top of the Figure. These portions are upsized by 0.08 µm, i.e., the difference between 0.24 µm and 0.16 µm, followed by a logical AND operation between the upsized portions and the poly 1 layer, to define portions of the poly 1 layer extending from 0.16 µm beyond the active area. Then, a logical OR (merge) is performed between the foregoing and regions 1505 of FIG. 15 to add these regions back to the poly 1 layer. The results of the preceding operations are shown as regions 1605 of FIG. 16. In the portion of the poly 1 layer shown, the above described operations recapture the original poly 1 linewidth from a point 0.16 µm beyond the active area. Although the preceding steps may not be necessary on structures such as these shown in the Figures herein, these steps will prevent notches or mousebites in poly 1 lines which make turns near the active area. At this point, the layout for the poly 1 has been completed, creating a poly 1 layer having gates of reduced dimension obeying all design rules. In the embodiment described herein, the reduced dimension portion of the gates have a dimension of 0.28 µm.

Figure 16:
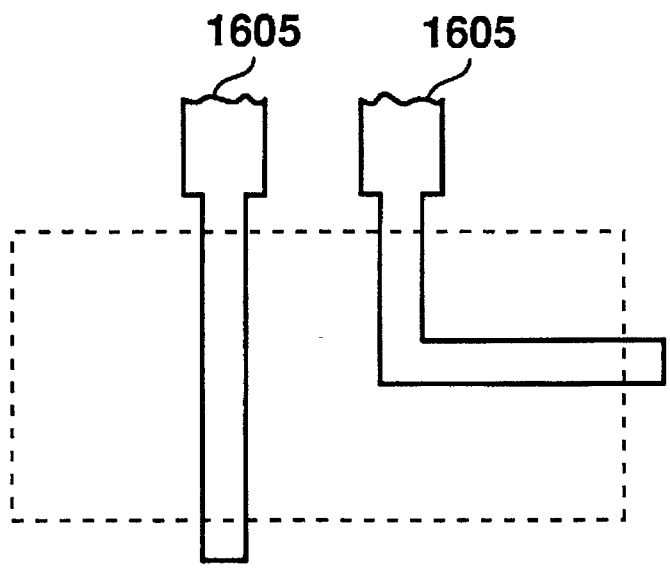
Figure 17:
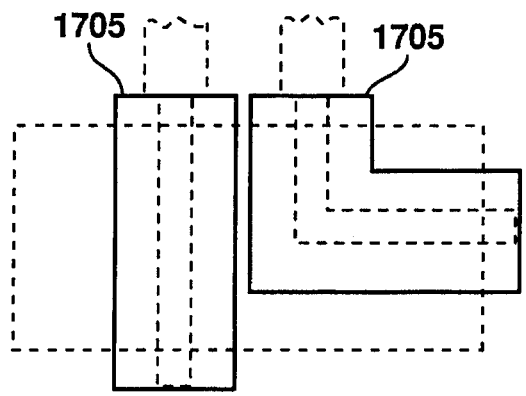
Figure 18:
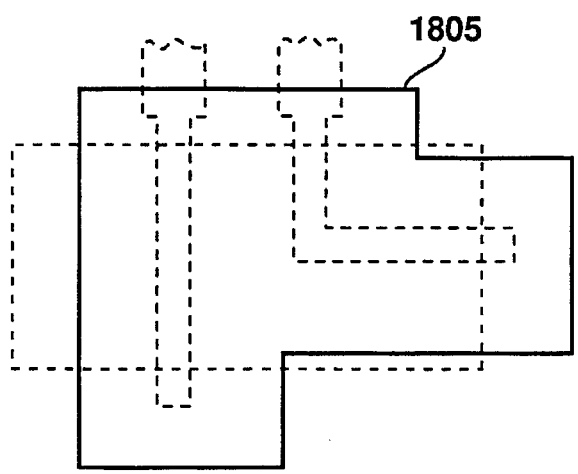
Figure 19:
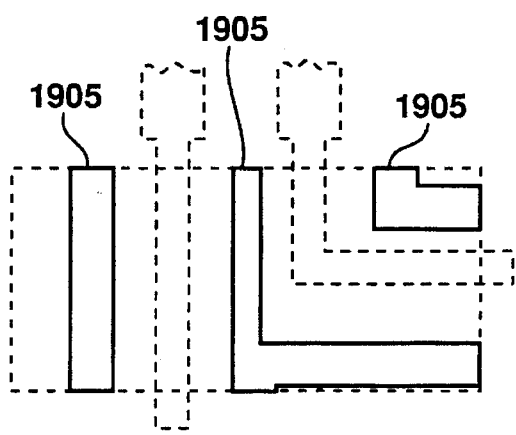
Figure 20:
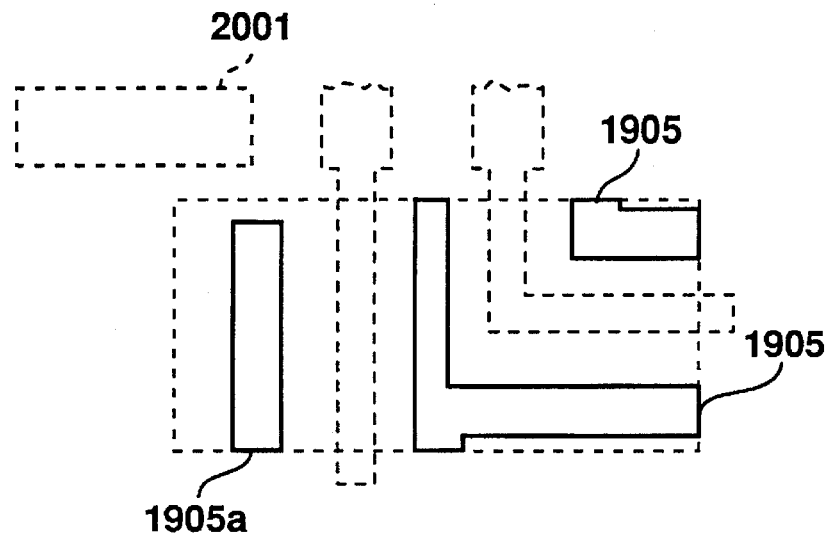
Figure 21:
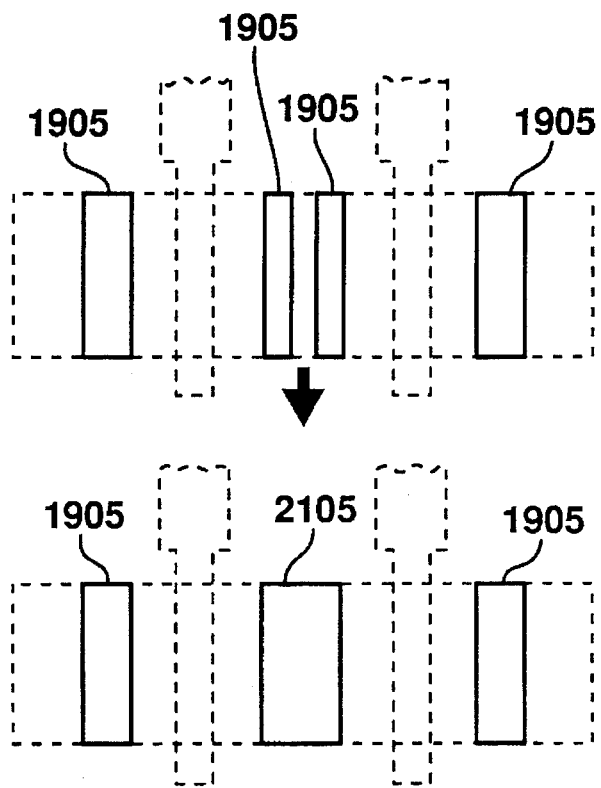
Figure 22:
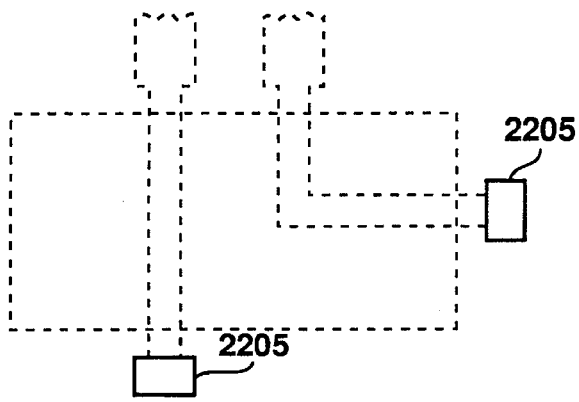

Next, the complimentary features which provide periodicity are created. The regions 1605 of FIG. 16 are ANDed with the diffusion layer to define the portions of the poly 1 layer near which the complementary features will be placed. Next, the resulting structure is upsized by the desired spacing of the standard complementary feature, which in a currently preferred embodiment is 0.28 μm, resulting in the regions 1705 shown in FIG. 17. Next, the regions 1605 are again ANDed with the diffusion layer and the resulting regions are sized up by twice the amount of the previous size up (0.56 μm) in a currently preferred embodiment, resulting in region 1805 shown in FIG. 18. Note that in the case of the two gates shown herein, this last upsize results in a single region because of the proximity of the gates. In some cases, where the gate spacing is greater, no such merger will occur. Next, the regions 1705 are subtracted from the region 1805 and the resulting regions are ANDed with the diffusion layer to create the regions 1905 of FIG. 19. The regions 1905 are essentially the complementary features which provide periodicity. Note that the effect of the above steps, upsizing the gate regions by 0.28 μm, and by 0.56 μm, and subtracting the first upsized region from the second, creates periodic complementary features with a width of 0.28 μm, which are spaced 0.28 μm from the gate (which also has a dimension of 0.28 μm). The last AND operation described immediately above is a precautionary measure to prevent the complementary features from extending beyond the diffusion regions, so that in no case do the complementary features interfere with active features over the field regions. As a further precaution, the complementary structures are spaced away from any poly 1 lines so that the complementary mask does not expose poly 1 line near a diffusion region. As described earlier, the complementary masks have openings which are greater then the complementary feature by 3 sigma of overlay, which is 0.12 μm in a currently preferred embodiment. Since these openings should be spaced 3 sigma of overlay from the poly 1 lines, the complementary features should be at least 0.24 μm from any poly 1 lines. This is accomplished by upsizing the poly 1 layer by 0.24 μm, and subtracting the result from the complementary features 1905. Referring to FIG. 20, the complementary feature labeled 1905a has been reduced by a small amount due to the presence of a portion of the poly layer labeled 2001 (not present in the other Figures) near complementary feature 1905a. Next, all complementary features that are below the minimum width (0.16 μm in a currently preferred embodiment) allowed by the design rules are removed. As there is always sufficient space for complementary features near most of the gate, this step does not remove significant portions of complementary features between gates, for example. Rather, small, odd-shaped portions of complementary features are removed in this step by downsizing and then up sizing a small amount, e.g., 0.12 μm in a currently preferred embodiment. Then, all complementary features which are below the minimum spacing allowed by the design rule (0.28 μm in a currently preferred embodiment) are merged into a single feature. FIG. 21 shows an example of two complementary features 1905 merged into a single complementary feature, labeled 2105.

Figure 23:
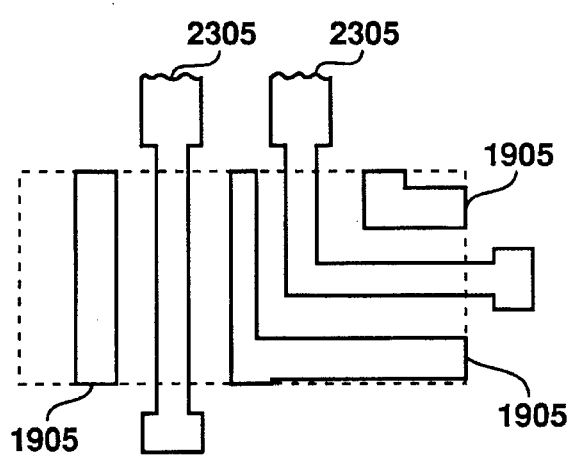

Next, all endcaps of the poly 1 layer which fall between the design rule and the minimum feature size (0.24 μm and 0.40 μm, respectively, in a currently preferred embodiment) are found and extended to the design rule amount and the original feature width. The extended endcaps are shown as regions 2205 in FIG. 22. This extension is added to the regions 1605 of FIG. 16. This extension is a precautionary measure to reduce the effect of rounding and consequent possibility of punchthrough. FIG. 23 shows the final layout having the polysilicon lines 2305 having reduced width gates and extended endcaps, and complementary features 1905, which is essentially the structure shown in FIG. 7, used to describe the principal of the present invention. The upper portions of the polysilicon features 2305 extend for example as shown in FIG. 7.

Figure 24:
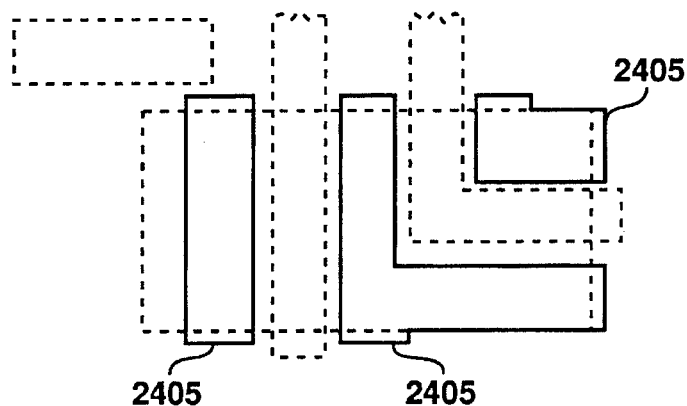
Figure 25:
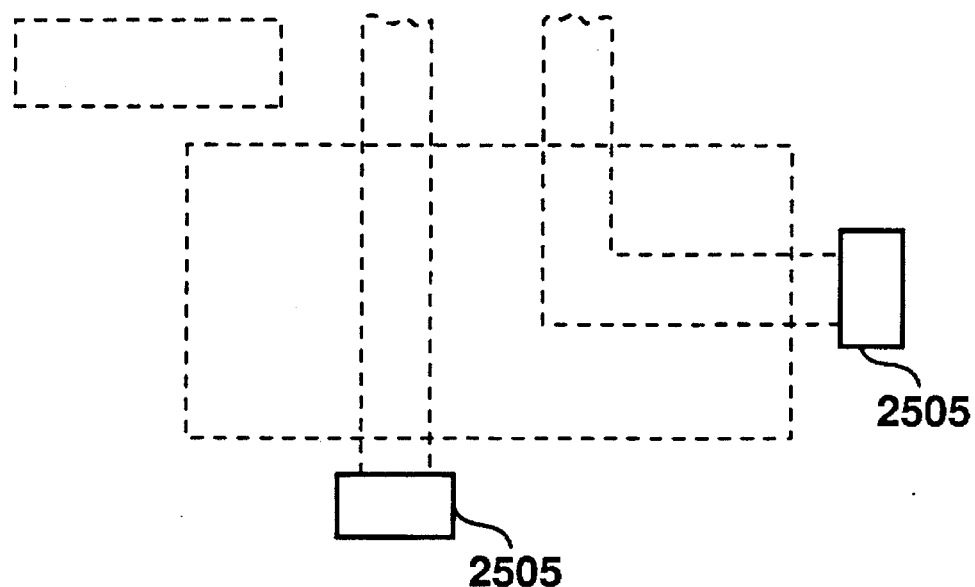

To create the complementary mask described earlier, the complementary features are inverted and appropriately upsized. Regions 1905 of FIG. 19 are first inverted (i.e., changed from light field to dark field). Next, the inverted regions are upsized by 3 sigma of overlay per side, 0.12 μm in a currently preferred embodiment. These sized up regions are shown as regions 2405 of FIG. 24. As described earlier, the endcaps may be extended, to prevent rounding and therefore punchthrough. However, the extended endcaps typically cannot remain as they may interfere with other portions of the device layer. Therefore, regions 2505 of FIG. 25 are created, which regions correspond to the extended portion of the endcaps inverted and upsized by 3 sigma of overlay per side. These regions are then merged with the regions 2405 to create the complementary mask comprising regions 2405 and 2505 as shown in FIG. 26. The regions 2405 and 2505 of FIGS. 24–26 represent open regions in a dark field. Thus, using the mask shown in FIG. 23, a latent image of polysilicon lines having reduced gates is created. Then, using the mask created by the plot shown in FIG. 26, the complementary structures and the extended endcaps are obliterated and, as described earlier, additional exposure intensity which improves resolution is provided. As described before, upon development, a patterned photoresist layer 800 as shown in FIG. 8 disposed over diffusion region 803, is created.

As described above, in a preferred embodiment the invention is used to form an image in a positive photoresist layer by performing an exposure with a mask having a device layer and complementary features, followed by an exposure using the complementary reticle. It will be appreciated that if desired, a first exposure and development cycle followed by a second exposure and development cycle can be performed prior to the etch. Alternatively, an etch step may follow each exposure/development cycle. However, these latter two embodiments require significantly more processing. As a further alternative, the present invention can be practiced on a negative photoresist layer. The negative photoresist is first exposed to a reverse field reticle corresponding to any of the reticles described herein having the active and complementary features, for example, the reticle shown in FIG. 3. Next, the photoresist is developed and an etch is performed resulting in polysilicon elements corresponding to the active and complementary features. Then, a second photosensitive layer is applied which is then exposed to a reverse field reticle corresponding to the appropriate complementary reticle. The second photosensitive layer is then developed, followed by an etch to remove the complementary features. Thus, the embodiment utilizing a negative resist requires an additional photoresist layer, develop, and etch step compared with the positive resist embodiment. Many further alternative embodiments will be apparent to one skilled in the art upon reading this disclosure. The present invention can be used to form a reduced dimension in all or any portion of any device layer.

As described earlier, the reticles of the present invention are fabricated by performing a sequence of steps on an already existing device layer. Alternatively, the device layer can be initially created utilizing the teachings of the present invention to create a device layer having periodic structures.

Additionally, a device layer can be created wherein all portions of the layer, not just selected portions, have reduced dimensions due to the periodicity. In such an embodiment, some portions may be periodic due to the layout of the active features, while only other portions, such as the gates, or polysilicon lines on the ends of a plurality of polysilicon lines, have complementary features placed nearby.

Thus, a method and apparatus for achieving enhanced resolution characteristic of periodic structures, on random, isolated features is described. The present invention can be used to form, for example, transistor gates of reduced dimension and therefore improved performance. Also, the present invention achieves the tighter line width control typical of periodic features, on isolated features. Additionally, a method is described for providing a device layer layout including the periodic structures, as well as a layout for a complementary reticle to remove the periodic structures, which method can be performed automatically.

What is claimed is:

1. A method of modifying a semiconductor device layer layout of a semiconductor device layer comprising the steps of:
   a) providing data that defines said semiconductor device layer layout in a database;
   b) identifying a portion of said semiconductor device layer layout, said portion comprising an active feature of said semiconductor device layer;
   c) downsizing said portion by a first amount to form a downsized portion; and
   d) placing a complementary feature proximate said downsized portion to form said modified device layer layout in said database.

2. The method as described in claim 1 wherein said device layer layout comprises a transistor gate, wherein said portion of said device layer layout comprises said transistor gate, wherein said step b is performed by a method comprising performing a logical AND operation between said device layer layout and a diffusion layer, and wherein said step c is performed by identifying a first region alongside said portion, upsizing said first region by said first amount to form a first upsized region, performing a logical AND operation between said first upsized region and said device layer layout to define border regions, and subtracting said border regions from said device layer layout to form said transistor gate.

3. The method as described in claim 2 wherein said identification of said first region alongside said portion is performed by upsizing said portion by a second amount to form a second upsized region and subtracting said portion from said second upsized region.

4. The method as described in claim 1 wherein said step d is performed by a method comprising upsizing said downsized portion by a third amount to form a third upsized region, upsizing said downsized portion by a fourth amount to form a fourth upsized region, and subtracting said third upsized region from said fourth upsized region to form a complementary region comprising said complementary feature.

5. The method as described in claim 2 wherein said step d is performed by a method comprising upsizing said downsized portion by a third amount to form a third upsized region, upsizing said downsized portion by a fourth amount to form a fourth upsized region, and subtracting said third upsized region from said fourth upsized region to form a complementary region comprising said complementary feature.

6. The method as described in claim 3 wherein said step d is performed by a method comprising upsizing said downsized portion by a third amount to form a third upsized region, upsizing said downsized portion by a fourth amount to form a fourth upsized region, and subtracting said third upsized region from said fourth upsized region to form a complementary region comprising said complementary feature.

7. The method as described in claim 4 wherein said fourth amount is approximately two times said third amount.

8. The method as described in claim 5 wherein said fourth amount is approximately two times said third amount.

9. The method as described in claim 6 wherein said fourth amount is approximately two times said third amount.

10. The method as described in claim 4 further comprising the step of performing a logical AND operation between said complementary region and a diffusion layer.

11. The method as described in claim 5 further comprising the step of performing a logical AND operation between said complementary region and said diffusion layer.

12. The method as described in claim 6 further comprising the step of performing a logical AND operation between said complementary region and said diffusion layer.

13. The method as described in claim 1 further comprising steps of upsizing and then downsizing said downsized portion a fifth amount.

14. The method as described in claim 2 further comprising steps of upsizing and then downsizing said downsized portion a fifth amount.

15. The method as described in claim 3 further comprising steps of upsizing and then downsizing said downsized portion a fifth amount.

16. The method as described in claim 1 further comprising providing a complementary layer layout comprising the steps of inverting said complementary feature and upsizing said inverted complementary feature.

17. The method as described in claim 2 further comprising providing a complementary layer layout comprising the steps of inverting said complementary feature and upsizing said inverted complementary feature.

18. The method as described in claim 3 further comprising providing a complementary layer layout comprising the steps of inverting said complementary feature and upsizing said inverted complementary feature.

19. The method as described in claim 1 wherein said active feature comprises an isolated feature.

20. The method as described in claim 19 wherein said isolated feature comprises a transistor gate.

* * * * *

UNITED STATES PATENT AND TRADEMARK OFFICE
CERTIFICATE OF CORRECTION

PATENT NO. : 5,498,579
DATED : March 12, 1996
INVENTOR(S) : Borodovsky et al.

It is certified that error appears in the above-identified patent and that said Letters Patent is hereby corrected as shown below:

In column 11 at line 1 delete "complimentary" and insert --complementary--

Signed and Sealed this

Twelfth Day of August, 1997

*Attest:*

BRUCE LEHMAN

*Attesting Officer*  *Commissioner of Patents and Trademarks*